AUTOMATIC GAIN CONTROL CIRCUIT

Filed Feb. 24, 1960 2 Sheets-Sheet 1

INVENTOR
V. R. SAARI
BY [signature]
ATTORNEY

Feb. 7, 1961 V. R. SAARI 2,971,164

AUTOMATIC GAIN CONTROL CIRCUIT

Filed Feb. 24, 1960 2 Sheets-Sheet 2

INVENTOR
V. R. SAARI
BY [signature]
ATTORNEY

United States Patent Office 2,971,164

Patented Feb. 7, 1961

2,971,164

AUTOMATIC GAIN CONTROL CIRCUIT

Veikko R. Saari, Chatham, N.J., assignor to Bell Telephone Laboratories, Incorporated, New York, N.Y., a corporation of New York Filed Feb. 24, 1960, Ser. No. 10,673

5 Claims. (Cl. 330—145)

Figure 1:
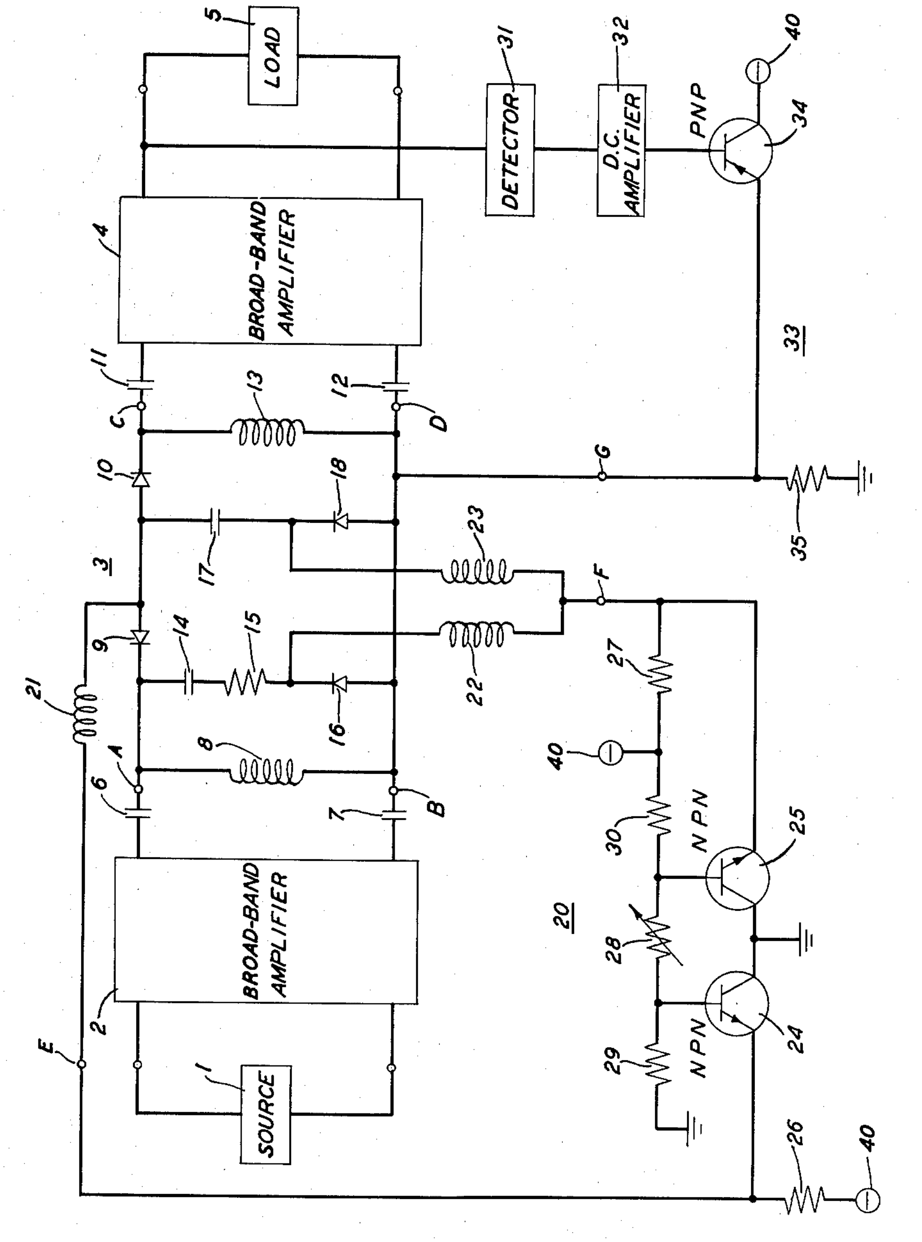

This invention relates to automatic gain control circuits and particularly to automatic gain control circuits for broad-band amplifiers.

When it becomes necessary to apply automatic gain control to broad-band amplifiers much difficulty is encountered due to the fact that the transmission of the amplifier, as well as its input and output impedances, varies with the operating level and thus with the automatic gain control signal. Since the input impedance of one stage may resonate with the output impedance of the preceding stage, such impedance variations in response to automatic gain control signals applied to one stage usually adversely affect the transmission characteristic of the entire amplifier chain. This difficulty is especially pronounced when transistors are used as the active elements in the amplifier stages. Here, the input circuit of a transistor in conjunction with interstage tuning circuits becomes the loading circuit of the preceding stage; and, therefore, a change in the input impedance of a succeeding stage will cause a change in the loading and therefore the gain and bandwidth of the preceding stage. For example, if a transistor is connected in the common emitter configuration to be used as a broad-band amplifier and the collector voltage and/or emitter current thereof are varied by a gain control signal, the loading effect of the transistor on the tuned circuits in its input and output circuitry will cause a change in the Q and the bandwidth of the tuned circuits.

One approach which has been employed to eliminate the problems referred to above has involved the use of variable attenuators connected in tandem between the amplifier stages and arranged to introduce a variable loss in response to an automatic gain control signal. Here too, however, difficulties have been encountered in circuits of reasonable simplicity because variations in the impedances of the attenuator have served to distort the gain-frequency characteristic of the amplifier stages between which the attenuator is connected.

It is accordingly the object of the present invention to improve automatic gain control circuitry for broad-band amplifiers to permit control of the gain of such amplifiers without introduction of distortion in the signals to be transmitted by the amplifiers.

In accordance with the invention, therefore, variable attenuators connected in tandem between amplifier stages and controlled to maintain a desired output level are arranged to have substantially constant input and output impedances over the frequency range of the signal passed by the broad-band amplifiers so that the gain and bandwidth of the preceding stage will remain substantially constant for all values of automatic gain control signal. The attenuators may consist of a diode ladder network of any number of meshes having means for maintaining substantially constant input and output impedances wherein the objects of the invention are accomplished by properly choosing the gain-controlling bias currents supplied to the diodes. Each diode is connected between two nodes, one having a constant voltage and the other having a variable voltage. The variable voltage is the gain control signal which is fed back from the output of the broad-band amplifier to control the attenuation of the signal passed through the attenuator. In the attenuator, a resistor having a value comparable to the input impedance of that part of the broad-band amplifier which succeeds the attenuator is placed in series with the shunt diode that is across the output of the preceding amplifier. When the shunt diodes in the attenuator are conducting and the series diodes are not, the resistance of this resistor appears as the dominant part of the input impedance of the attenuator, and this is comparable to the input impedance when the series diodes are conducting and the shunt diodes are not conducting.

Figure 2:
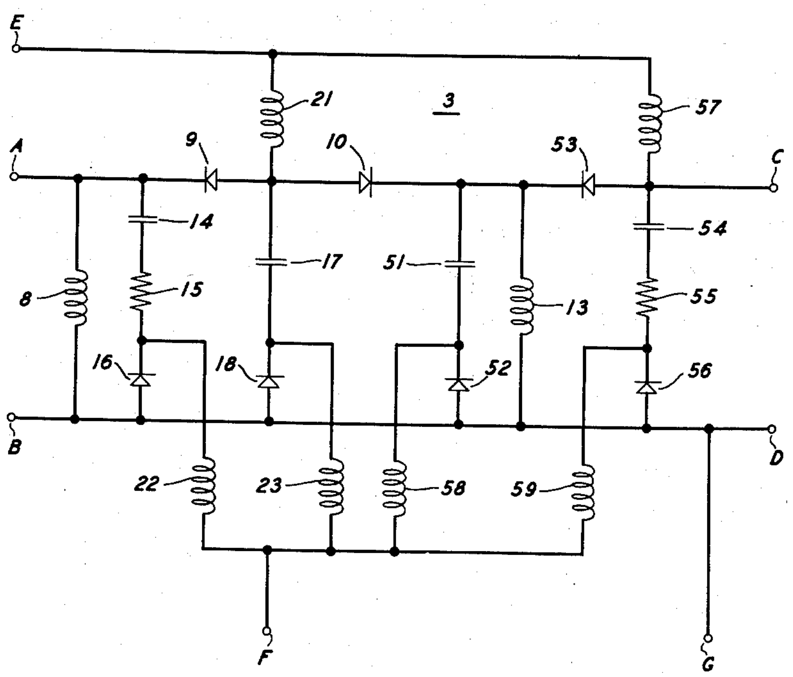

These and other features and advantages of the invention will appear more clearly and fully upon consideration of the following specification taken in connection with the drawing in which:

Fig. 1 is a schematic circuit diagram of an automatic gain control circuit in accordance with the present invention; and Fig. 2 is a schematic circuit diagram of a modification of the attenuator shown as part of Fig. 1.

Fig. 1 represents a broad-band amplifier provided with automatic gain control in accordance with the invention. This amplifier which comprises broad-band stages 2 and 4, together with auxiliary circuitry, is shown as being connected between a source 1 and a load 5. By way of example, the broad-band amplifier may be thought of as the intermediate-frequency amplifier of a radio receiver. In this case, the source 1 comprises the mixer and preceding circuitry, and the load 5 comprises the detector or demodulator and succeeding circuitry of the receiver. The output of source 1 appears as the input to broad-band amplifier stage 2 which amplifies this signal. The amplified signal appears at the output of amplifier stage 2 which is connected to the input of an attenuator 3. The signal appearing at the output of attenuator 3 is amplified by broad-band amplifier 4 and then supplied to load 5. The amount of attenuation introduced by variable attenuator 3 is made to vary with the strength of the signal reaching load 5 to produce automatic gain control action.

The detailed circuit may now be more fully considered. Thus, the attenuator 3 is coupled to broad-band amplifier stage 2 through direct-current blocking capacitors 6 and 7. A transformer could be used in place of these capacitors. Across the input of attenuator 3 at points A and B is a radio frequency choke 8 which appears as an open circuit for the signal frequency and as a direct-current path from the lower input terminal at point B to the upper input terminal at point A of the attenuator. The signal is passed by series diodes 9 and 10 and is coupled out of the attenuator 3 to the broad-band amplifier stage 4 through direct-current blocking capacitors 11 and 12. Again, a transformer could be used instead of the blocking capacitors. Across the output circuit of attenuator 3 at points C and D is a radio frequency choke 13, which also appears as an open circuit at the frequency of the signal and acts as a direct-current path between the lower output terminal at point D and the upper output terminal at point C of attenuator 3.

In conjunction with the series diodes 9 and 10, there are two shunt connections that complete this typical embodiment of the variable attenuator 3. Across the input of variable attenuator 3 between points A and B is the series connection of a capacitor 14, a resistor 15 and a shunt diode 16. Between the intermediate point of attenuator 3 at the junction of series diodes 9 and 10 and the lower conductor of attenuator 3 is the series connection of a capacitor 17 and a shunt diode 18.

The series diodes 9 and 10 and the shunt diodes 16 and 18 of attenuator 3 are biased in part by a fixed bias circuit 20. The bias voltage outputs from circuit 20 are coupled from point E to the series diodes through a radio frequency choke 21 and from point F to the shunt diodes through radio frequency chokes 22 and 23. The fixed bias circuit 20 comprises NPN transistors 24 and 25, each connected in the emitter-follower configuration, and their respective biasing resistors. Transistor 24 has a resistor 26 connected between its emitter and a source 40 of negative potential and transistor 25 has a resistor 27 connected between its emitter and the negative potential source 40. At any particular value of the control voltage, the relative emitter voltages of transistors 24 and 25 determine the biasing of the diodes in attenuator 3 and these voltages are controlled by adjusting a variable resistor 28 which is connected between the bases of these transistors. The bias voltage on the NPN transistors is supplied to the bases of these transistors through the voltage divider circuit comprising the series connection of the variable resistor 28 and resistors 29 and 30.

The fixed bias supply 20 could be replaced by batteries or similar direct-current voltage sources provided the shunt diodes 16 and 18 are connected to a more negative potential with respect to a common point, herein represented as ground, than the series diodes 9 and 10. However, the advantage of a low current drain from the source 40 for the normal operating conditions of a high signal level obtained by using NPN transistors in the fixed bias circuit would not be obtainable with a battery source. This low current drain from the negative source also would not be obtainable if the NPN transistors were replaced by PNP transistors. This is true because the PNP transistors would draw a large current from the negative source in the normal operating condition.

The initial bias, obtained as discussed above, is modified in accordance with the level of the message signal appearing at the output of amplifier stage 4. Accordingly, a portion of the output of broad-band amplifier stage 4 is demodulated by a detector 31, connected across the output of amplifier stage 4 to yield a direct-current voltage which is amplified with respect to a fixed reference level by a direct-current amplifier 32. The output stage 33 of direct-current amplifier 32 illustrates a preferred circuit that has a low current drain from source 40 under normal operating conditions for the broad-band amplifier. This output stage 33 comprises an active element 34, which is a PNP transistor connected in an emitter follower configuration, and a resistor 35. The amplified direct-current voltage from the direct-current amplifier is applied through this output stage to point G in the attenuator 3 as the variable gain control signal. Since radio frequency chokes 8 and 13 are effectively a short circuit for direct-current, the control voltage may be considered as also being applied to points A and C.

The normal operating condition of the circuit is chosen as that existing when the broad-band input signal from source 1 is substantially maximum. Under this condition the relative bias voltages on the diodes in attenuator 3 are made such that shunt diodes 16 and 18 are biased in their forward direction and series diodes 9 and 10 are biased in their reverse direction. The impedance between points A and B as seen by the input signal is approximately equal to the resistance of resistor 15 because the series diodes 9 and 10 in their nonconducting state present a very high impedance in parallel with the low impedance of the series connection of the direct-current blocking capacitor 14, resistor 15 and conducting shunt diode 16.

The broad-band input signal to attenuator 3 appears between points A and B, and by voltage divider action will be developed mainly across the large impedance of the non-conducting series diode 9 rather than the small impedance of the series combination of capacitor 17 and conducting shunt diode 18. Therefore, only a small portion of the input signal will appear across the series combination of capacitor 17 and diode 18. Of this signal, in turn, only a small portion will appear at the input of broad-band amplifier stage 4 because of the voltage divider action of the divider comprising the large impedance of nonconducting series diode 10 and the relatively small input impedance of broad-band amplifier stage 4. Thus attenuator 3 introduces large attenuation in the interstage coupling between amplifier stages 2 and 4.

At the other extreme of input signal level, when the input signal from source 1 decreases, the control voltage that appears at points A, C and G will become more negative and will cause the series diodes 9 and 10 to be forward biased and the shunt diodes 16 and 18 to be reverse biased. The input impedance of attenuator 3, as seen by the broad-band amplifier stage 2, will be approximately the input impedance of broad-band amplifier stage 4 because the now forward biased series diodes 9 and 10 will present a low resistance between the two amplifier stages and the shunt paths across the input of amplifier stage 4 and the output of amplifier stage 2 will have approximately infinite impedance as presented by radio frequency chokes 8 and 13 and reverse biased shunt diodes 16 and 18.

The input signal to attenuator 3 appearing between points A and B will be divided by voltage divider action between series diode 9 and the series combination of capacitor 17 and shunt diode 18. The greater portion of this input signal will appear across the large impedance of the nonconducting shunt diode 18. Because of the negligible impedance of the conducting series diode 10 as compared to the input impedance of amplifier stage 4, substantially the total signal appearing across the series combination of capacitor 17 and diode 18 will be applied as an input to amplifier stage 4. Therefore, the major part of the input signal to attenuator 3 will be applied as an input to amplifier 4, and only a small attenuation will be introduced for the weak signal condition.

The output signal level of amplifier stage 4 may be made substantially constant for all values of signal level from source 1 and for all values of the temperature-dependent gain of amplifier stage 4 by the action of the variable attenuator 3 as discussed above. As the strength of the input signal decreases, the portion of the input signal dissipated by the attenuator will decrease and more of the input signal will be applied as the input to amplifier stage 4, tending to keep this input level constant. Temperature variations in the gain of amplifier stages 2 and 4 are compensated for in the same manner.

It is seen that for two levels of input signal from source 1 the input impedance of attenuator 3, as seen by amplifier stage 2, is substantially equal to the value of the input impedance of amplifier stage 4. For a signal level intermediate to the strong signal and weak signal conditions, the input impedance of attenuator 3 will again be substantially equal to the input impedance of amplifier stage 4.

For an intermediate signal strength the gain control signal from the output stage 33 appearing at points A, C and G will be more negative with respect to ground than the control signal for the strong signal condition and less negative than for the weak signal condition.

Under the strong signal condition the relative biases on the series and shunt diodes are such that shunt diodes 16 and 18 are in their conducting state while the series diodes 9 and 10 are in their nonconducting state. As the effective input signal from source 1 decreases due to fading or some other similar condition, the shunt diodes 16 and 18 will conduct less and the series diodes 9 and 10 will conduct more, and there will be a point at an intermediate signal strength where the relative conduction of the series and shunt diodes will cause the input impedance of attenuator 3, as seen by amplifier stage 2, to be substantially equal to the input impedance of amplifier stage 4. This point of intermediate signal strength where the impedances of the series and shunt diodes are such that the input impedance of the attenuator is equal to the input impedance of amplifier 4 may be termed the crossover point for the diodes. This crossover point can be varied with respect to the two extremes of signal strength by varying the relative magnitudes of the fixed bias voltages on the diodes. To adjust the relative magnitudes of these biases the emitter voltages of transistors 24 and 25 have to be varied. These voltages can be varied by adjustment of variable resistor 28. By the proper selection of this crossover point, the input impedance of attenuator 3 can be made to be substantially constant and equal to the input impedance of amplifier stage 4 for all values of control voltage fed back from the output of amplifier 4.

As the shunt diodes conduct less and the series diodes conduct more, the greater portion of the input signal to attenuator 3 is presented as an input signal to amplifier stage 4 because of the decrease in attenuation by attenuator 3, thereby providing a signal output of substantially constant strength.

It is sometimes desirable to have an attenuator that not only has a constant input impedance over the operating range of the automatic gain control circuit, but also a constant output impedance. The schematic circuit diagram of Fig. 2 presents such a circuit. Fig. 2 also illustrates the addition of another mesh to provide a greater range of control by the circuit.

The attenuator of Fig. 2 would be inserted for attenuator 3 of Fig. 1 when it is desired to provide such extended range and constant output impedance.

The mesh required to extend the range of operation of the circuit consists of the shunt branch comprising the series combination of a direct-current blocking capacitor 51 and a shunt diode 52 and the series branch comprising a series diode 53. This mesh enables the amount of attenuation produced in a signal traversing the attenuator to be increased, thereby increasing the range of operation.

The output impedance of the attenuator is made substantially constant for all values of variable bias by connecting across the output of the attenuator a series combination of a direct-current blocking capacitor 54, a resistor 55 and a shunt diode 56. The resistor 55 has a value comparable to the output impedance of amplifier stage 2 as seen by attenuator 3. When the series diodes are conducting and the shunt diodes are not, the output impedance of attenuator 3 presented to amplifier stage 4 is substantially the output impedance of amplifier stage 2. This is true because the shunt branches of the attenuator which are in parallel with this output impedance all have a very large impedance as presented by either nonconducting shunt diodes or radio-frequency chokes.

When the series diodes are nonconducting and the shunt diodes are conducting, the output impedance of the attenuator presented to amplifier stage 4 is substantially equal to the value of resistor 55, because of the large impedances in parallel with the branch including resistor 55. At the crossover point of the diodes the output impedance of the attenuator will again be substantially equal to the output impedance of amplifier stage 2.

The addition of the means for extending the range of operation of attenuator 3 of Fig. 1 and making the output impedance substantially constant requires additional connections to the fixed bias supply 20 at points E and F of Fig. 1. The initial bias of series diode 53 is supplied through radio-frequency choke 57 and the initial bias of shunt diodes 52 and 56 is supplied through radio-frequency chokes 58 and 59, respectively.

From the above discussion it is apparent that if the range of the attenuator of Fig. 2 is to be extended still further, additional meshes can be added thereto.

What is claimed is:

1. In a multi-stage broad-band amplifier, an automatic gain control circuit comprising a pair of reversely poled nonlinear elements in tandem having a common junction therebetween, said elements being connected between an output terminal of a first amplifier stage and a input terminal of a second amplifier stage, a first series connection of a capacitor, a resistor and a shunt nonlinear element being connected across the output terminals of said first amplifier stage, said resistor having a value comparable to the input impedance of said second amplifier stage, a second series connection of a capacitor and a shunt nonlinear element connected between said common junction and a second junction to which the remaining output terminal of said first amplifier stage and the remaining input terminal of said second amplifier stage are connected, means for applying fixed voltages between said common junction and a reference point and between said reference point and the terminals of said shunt elements remote from said second junction, and means for applying variable voltages between the terminals of said shunt elements connected to said second junction and said reference point and between the terminal of said series elements remote from said common junction and said reference point, said variable voltages varying in accordance with the strength of the signal output of said first amplifier stage.

2. In a multistage broad-band amplifier, an automatic gain control circuit comprising a plurality of variable impedance paths across the output of a first amplifier stage and across the input of a second amplifier stage, a first of said paths having a value of impedance comparable to the input impedance of said second amplifier stage during the period when the signal passed by said first amplifier stage has maximum strength, means for controlling the impedance of each path so that the combined impedances of said paths as seen by the output of said first amplifier stage is comparable to the input impedance of said second amplifier stage, and means for varying the impedance presented to the signal passed by said first amplifier stage so that the signal level presented to said second amplifier stage is substantially constant at all times.

3. In combination, a source of broad-band signals, a load for utilizing said signals, a common connection between said source and said load, an attenuation network connected between said source and said load for maintaining the signal level at said load substantially constant over the entire band of signal frequencies, said network including a pair of diodes connected in series between said source and a first terminal of said load, one pair of like terminals of said diodes being connected together at a common point, a series connection of a resistor, a capacitor, and a diode connected across the output of said source, said resistor having an impedance comparable to the input impedance of said load, and a series connection of a capacitor and a diode connected between said common point and said common connection, said diodes of said series connections having one pair of like terminals connected to said common connection, means for applying a variable bias to all of said diodes to control the attenuation of said signal by said network, said applying means comprising a detector for converting a portion of the signal appearing across said load to a direct-current voltage, and means for applying a fixed bias to said diodes to make the input impedance of said network comparable to the input impedance of said load at an intermediate value of variable bias.

4. An asymmetrical attenuator having first and second input terminals and first and second output terminals, said attenuator comprising reversely poled nonlinear conduction devices in tandem between said first terminals, a direct connection between said second terminals, a first shunt path between said input terminals comprising a capacitor, a nonlinear conduction device and a resistor, a second shunt path connected between the junction of said reversely poled devices and said second terminals, means for applying a variable bias between said input and output terminals and a reference point to control the impedance value between said input and output terminals, and means for applying a fixed bias between said nonlinear devices and said reference point, said fixed bias having a value to make the input impedance of said attenuator comparable to the impedance of said resistor at an intermediate value of variable bias.

5. In a multistage broad-band amplifier, an automatic gain control circuit comprising a plurality of variable impedance paths across the output of a first amplifier stage and across the input of a second amplifier stage, a first of said paths having a value of impedance comparable to the input impedance of said second amplifier stage during the period when the signal passed by said first amplifier stage has maximum strength, a second of said paths having a value of impedance comparable to the output impedance of said first amplifier stage during the period when the signal passed by said first amplifier stage has maximum strength, means for controlling the impedance of each path so that the combined impedances of said paths as seen by the output of said first amplifier stage is comparable to the input impedance of said second amplifier stage and the combined impedances of said paths as seen by the input of said second amplifier stage is comparable to the output impedance of said first amplifier stage, and means for varying the impedance presented to the signal passed by said first amplifier stage so that the signal level presented to said second amplifier stage is substantially constant at all times.

No references cited.